United States Patent
Arvin et al.

(10) Patent No.: US 10,224,269 B2
(45) Date of Patent: Mar. 5, 2019

(54) ELEMENT PLACE ON LAMINATES

(71) Applicant: International Business Machines Corporation, Armonk, NY (US)

(72) Inventors: Charles L. Arvin, Savannah, GA (US); Brian M. Erwin, Lagrangeville, NY (US); Brian W. Quinlan, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/973,158

(22) Filed: Dec. 17, 2015

(65) Prior Publication Data

US 2017/0179015 A1 Jun. 22, 2017

(51) Int. Cl.
*H01L 21/44* (2006.01)
*H01L 23/498* (2006.01)
*H01L 21/48* (2006.01)
*H01L 21/56* (2006.01)
*H01L 23/31* (2006.01)

(52) U.S. Cl.
CPC .... *H01L 23/49838* (2013.01); *H01L 21/4853* (2013.01); *H01L 21/4857* (2013.01); *H01L 21/563* (2013.01); *H01L 23/3185* (2013.01); *H01L 23/49822* (2013.01); *H01L 2224/16225* (2013.01); *H01L 2224/83385* (2013.01); *H01L 2924/15311* (2013.01)

(58) Field of Classification Search
CPC ............. H01L 21/4853; H01L 21/4857; H01L 21/563; H01L 23/3185; H01L 23/49822; H01L 23/49838

USPC ................. 438/108, 118, 424, 613, 618, 666
See application file for complete search history.

(56) References Cited

U.S. PATENT DOCUMENTS

| 7,061,102 B2 * | 6/2006 | Eghan .................. H01L 23/055 257/713 |
|---|---|---|
| 7,387,945 B2 | 6/2008 | Hara |
| 7,550,845 B2 | 6/2009 | Zhao et al. |
| 8,084,858 B2 | 12/2011 | Daubenspeck et al. |
| 8,264,846 B2 | 9/2012 | Jones et al. |
| 8,335,084 B2 | 12/2012 | Lee et al. |
| 8,455,991 B2 | 6/2013 | Hsiao et al. |
| 8,564,121 B2 | 10/2013 | Ihara et al. |

(Continued)

FOREIGN PATENT DOCUMENTS

| CN | 103763860 A | 4/2014 |
|---|---|---|
| JP | 2000101231 A | 4/2000 |

(Continued)

OTHER PUBLICATIONS

Charles L. Arvin, et al.,"Laminate Warpage Control", U.S. Appl. No. 14/973,130, filed Dec. 17, 2015.

(Continued)

*Primary Examiner* — Hung Vu
(74) *Attorney, Agent, or Firm* — Cantor Colburn LLP; Jennifer Anda

(57) ABSTRACT

A module includes a laminate, the laminate including a solder mask layer and at least one depression in an upper surface of the solder mask layer that does not pass all of the way through the solder mask layer. The module also includes a first electronic element disposed in a first of the at least one depressions.

8 Claims, 9 Drawing Sheets

(56) References Cited

U.S. PATENT DOCUMENTS

| | | |
|---|---|---|
| 8,986,806 B1 | 3/2015 | Baloglu et al. |
| 2004/0184219 A1* | 9/2004 | Otsuka .............. H01L 23/49805 |
| | | 361/306.3 |
| 2012/0196075 A1 | 8/2012 | Takahashi et al. |
| 2012/0319300 A1* | 12/2012 | Kim ..................... H01L 25/105 |
| | | 257/777 |
| 2013/0010441 A1* | 1/2013 | Oganesian et al. .......................... |
| | | H01L 23/5389 |
| | | 361/752 |
| 2015/0040389 A1 | 2/2015 | Ishiguro et al. |
| 2015/0091132 A1 | 4/2015 | Kim et al. |

FOREIGN PATENT DOCUMENTS

| | | |
|---|---|---|
| JP | 2011101959 A | 5/2011 |
| WO | 2008094714 A1 | 8/2008 |
| WO | 2015048368 A1 | 4/2015 |

OTHER PUBLICATIONS

Charies L. Arvin, et al.,"Protection of Elements on a Laminate Surface", U.S. Appl. No. 14/973,151, filed Dec. 17, 2015.
List of IBM Patents or Patent Applications Treated as Related; Date File: Dec. 17, 2015, pp. 1-2.

* cited by examiner

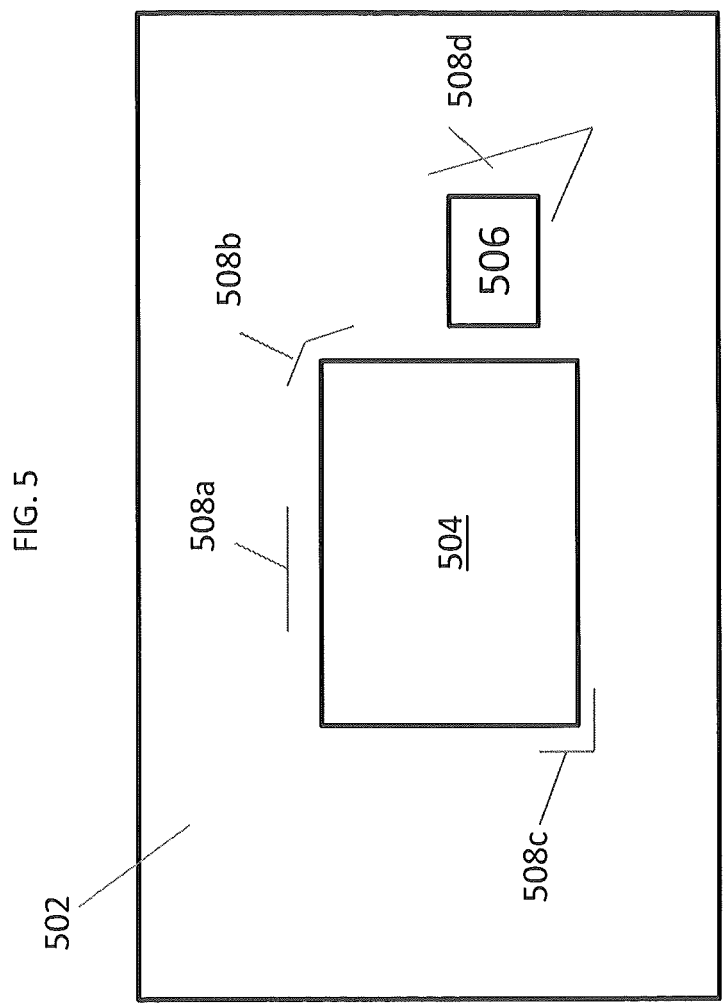

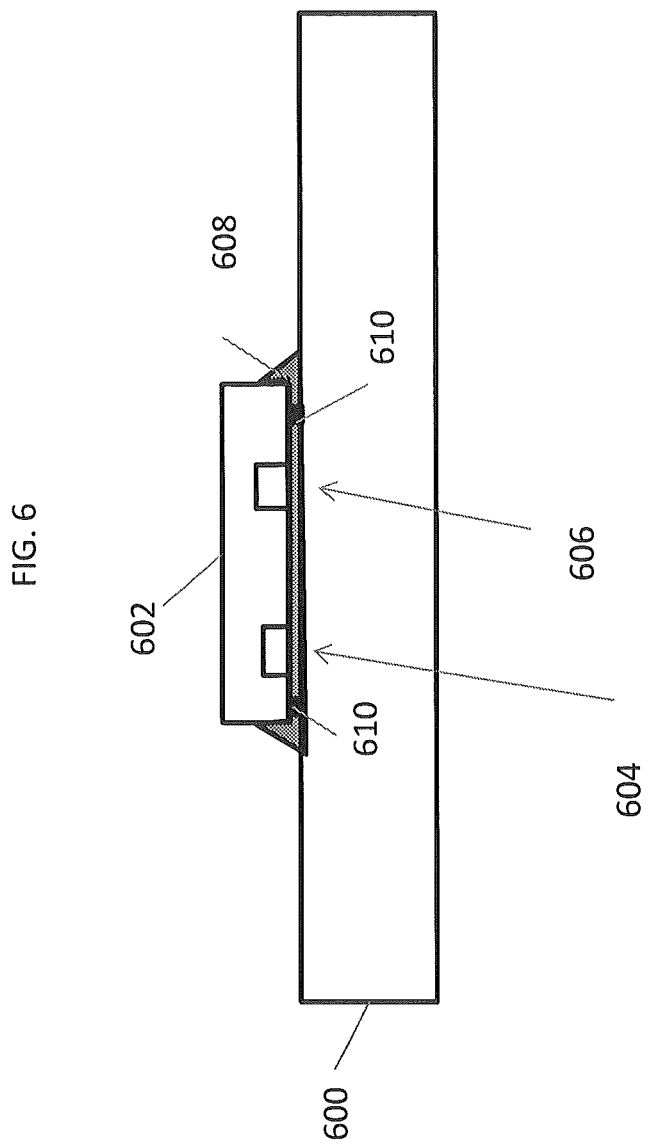

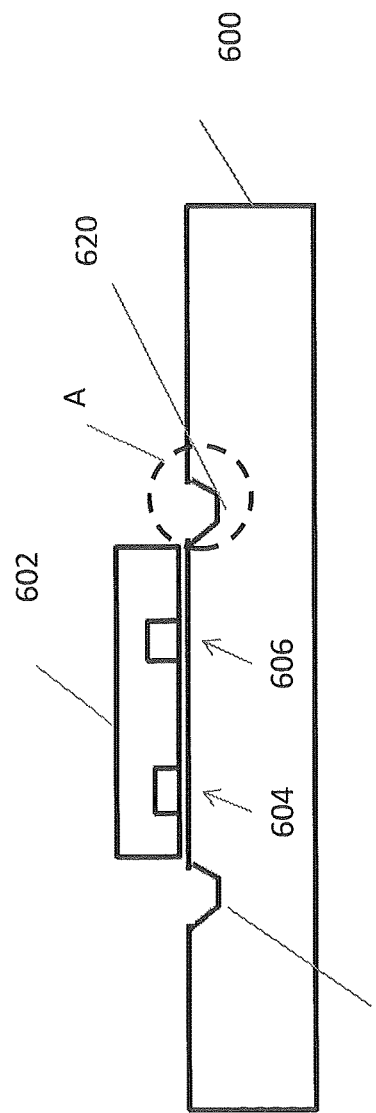
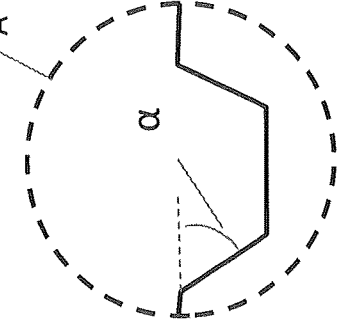
FIG. 7A
FIG. 7B

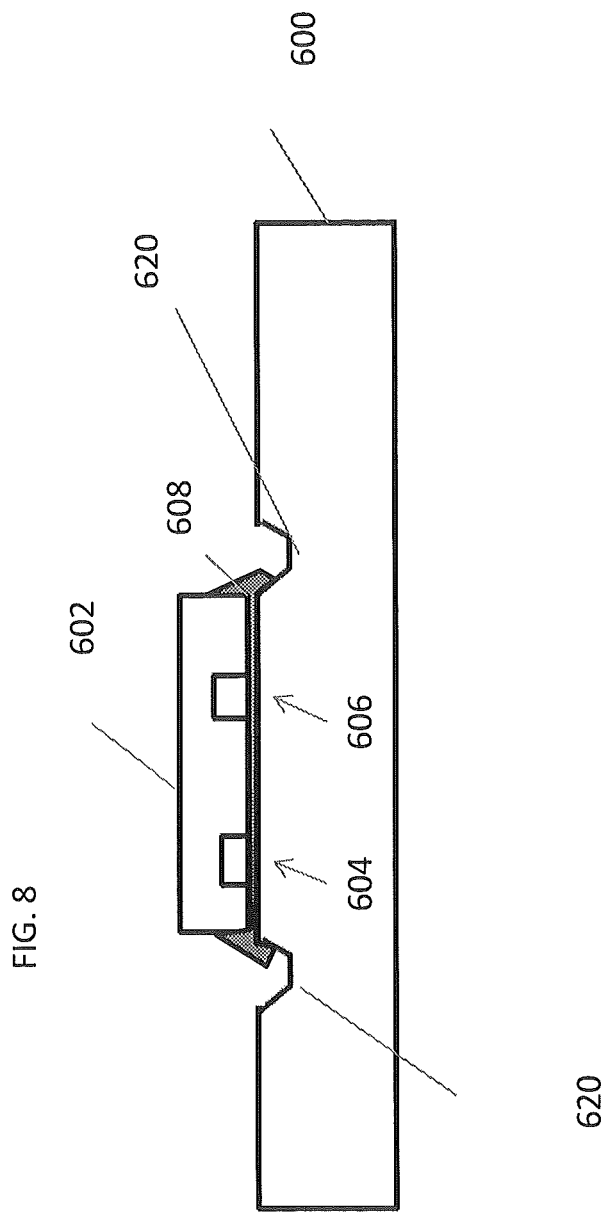

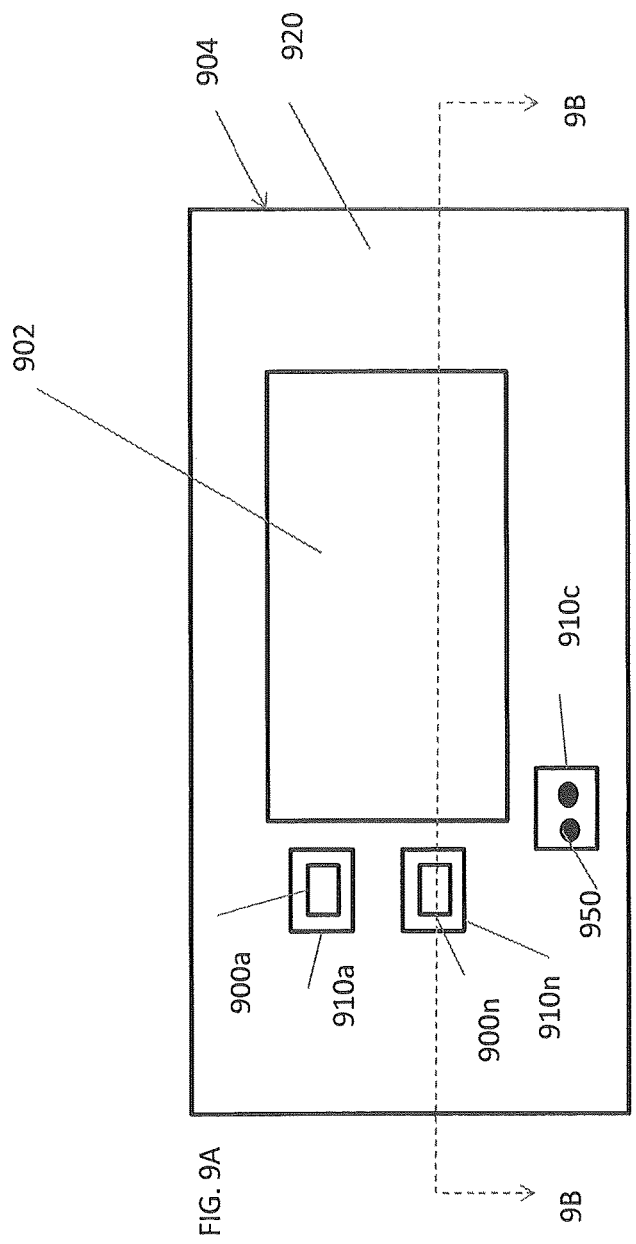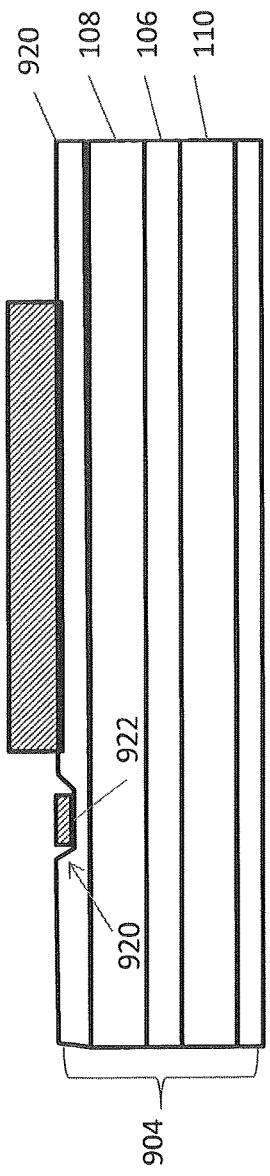

ELEMENT PLACE ON LAMINATES

BACKGROUND

The present invention relates to microelectronic devices and, and more specifically, to placing electronic elements on a laminate.

Once formation of semiconductor devices and interconnects on a semiconductor wafer is completed, the semiconductor wafer is diced into semiconductor chips, or "dies." Functional semiconductor chips are then packaged to facilitate mounting to a larger device.

The packaging generally provides mechanical protection and electrical connections to an external element. One typical packaging technology is Controlled Collapse Chip Connection (C4) packaging, which employs C4 balls each of which contacts a C4 pad on the semiconductor chip and another C4 pad on a packaging substrate. The packaging substrate may then be assembled on a larger circuit board. The combined chip and laminate may be referred to as a module in some cases. Of course, a module may include other elements such as a lid.

Mounting electrical components such as discrete resistors, discrete capacitors, transistors, digital circuits, etc. on laminate is well known. It is common for such laminate to contain many layers. Typically, most of the components are mounted on the surface. Some of the conductors used to interconnect the components may also be printed on the surface. The inner layers are primarily used to interconnect the components through other conductors printed on these inner layers and conductive vias passing through the outer and inner layers. For complex circuits, the surface area must be carefully allocated to fit the many requisite components. Also, in the case of capacitor components, it is desirable to position some of the capacitors near other, associated components to minimize path length and thereby minimize parasitic inductance.

As will be understood, greater the number of interconnects in a particular area, the more likely it is that differences in a coefficient of thermal expansion (CTE) between the interconnect (e.g., wires) and the surrounding laminate material may result in deformation of the laminate in such a region. The deformation can lead to buckling or other deformation of laminate. This may, in turn, cause connections on the surface to break. One such possible break may occur between the capacitors and the die. Of course, buckling or other deformation could cause other defects or malfunctions to occur as well.

Further, in operation, the die may include some areas that run hotter than others. This can, again, lead to stresses experience by connections (e.g., the C4) between the die and the laminate. Such stresses can, in severe cases, lead to a broken connection which can reduce the effectiveness of a particular die.

SUMMARY

According to an embodiment of the present invention, a method of forming a module is disclosed. The method includes: receiving a laminate, the laminate including a solder mask layer; forming at least one depression in an upper surface of the solder mask layer that does not pass all of the way through the solder mask layer; placing a first electronic element in a first of the at least one depressions; and exposing the laminate to a reflow process after the first electronic element is placed.

According to another embodiment of the present invention, a module is disclosed. The module includes a laminate, the laminate including a solder mask layer and at least one depression in an upper surface of the solder mask layer that does not pass all of the way through the solder mask layer. The module also includes a first electronic element disposed in a first of the at least one depressions.

BRIEF DESCRIPTION OF THE DRAWINGS

FIG. 5 shows a top view of a laminate with protection features disposed/formed thereon;

FIG. 6 shows an example of a laminate with a die secured thereto including a layer of underfill;

FIGS. 7A and 7B show, respectively, a die placed on an upper surface of a laminate and surrounded by trench type protection features form in the upper surface and a close up view of one of the trenches;

FIG. 8 shows a die placed on an upper surface of a laminate and surrounded by trench type protection features form in the upper surface after underfill has been added; and FIGS. 9A and 9B show a laminate in top view and cross-section that includes depressions for placement of elements on the upper surface of the laminate.

DETAILED DESCRIPTION

Provided herein are methods of forming a laminate and placing an electronic element on the laminate.

Figure 1:
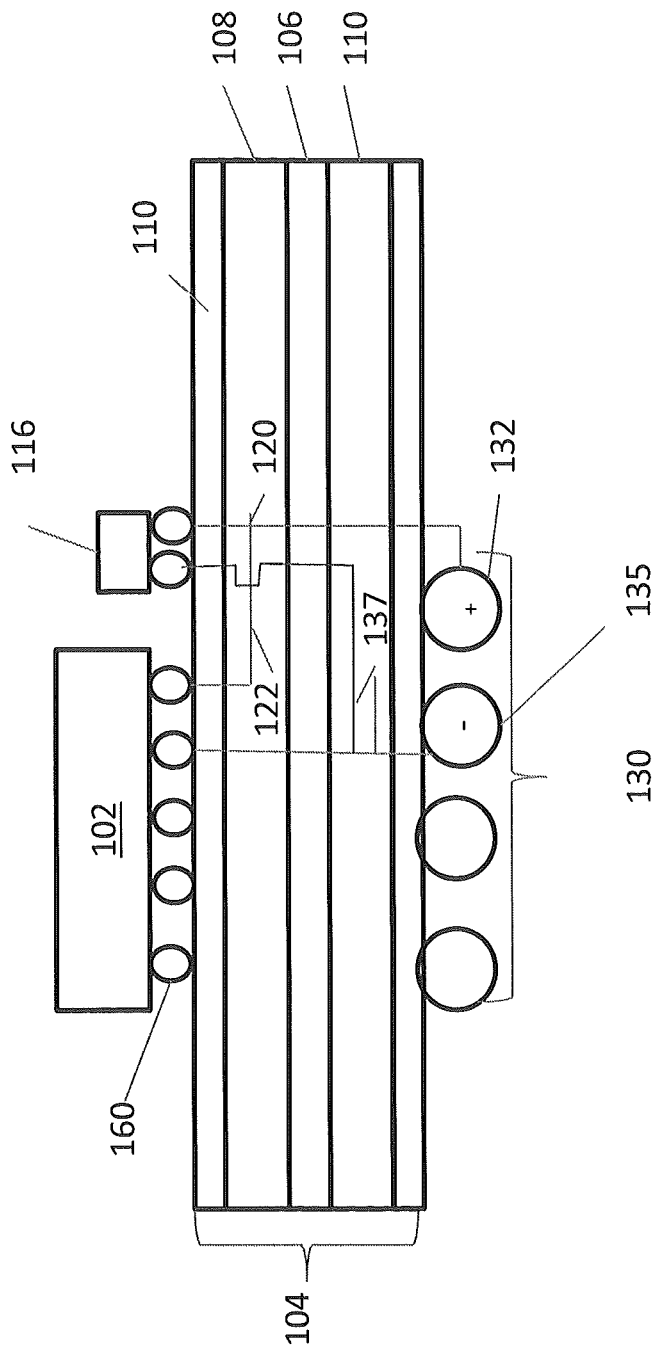
FIG. 1 shows a side view of an example of laminate having a die connected thereto.

With reference now to FIG. 1 a simple block diagram of a portion of a microelectronic device 100 is shown. The device 100 includes a chip 102. The chip can be an integrated circuit or other type of device and is sometimes referred to as die. A decoupling capacitor or other supplementary element 116 (e.g., a resistor, inductor, voltage regulator) may also be supported. The purpose of such elements is known and further, as disclosed herein, it may be beneficial that such elements be as close to the chip 102 as possible. While the following discussion may refer to a capacitor, it shall be understood that element 116 may be any of the elements discussed above or any other element.

The chip 102 and element 116 are supported by and carried on a laminate 104. The laminate 104 may be formed (but need not be) such that it includes a core 106. The core 106 may include metal or other connection elements that connect certain elements to other elements and be formed of a glass-cloth polymer. For simplicity sake, only three connection elements (connections 120, 122 and 137) are shown and are discussed further below.

The laminate 104 also includes a top build up layer 108 and a bottom build up layer 110. The top and bottom build up layers are typically formed of an organic composite polymer. The bottom build up layer 110 may include means for connecting a ball grid array 130 so that power, ground and data can be delivered from an external to the chip 102 or vice versa. Of course, the ball grid array 130 may be replaced with a so-called land grid array in certain instances.

Either allows the module (combination of chip 102 and laminate 104) to be connected, for example, to a printed circuit board.

A solder mask 110 may be formed on top of the top build up layer 108. The solder mask 110 allows for connections from the chip 102 and element 116 to the laminate 104. As shown, solder balls 160 are used to for such connections. Of course, other connection mechanisms may be utilized. To make the connections, a reflow process is performed that may give rise to the stresses on the laminate described above. In some cases, a solder mask 111 is also formed on the bottom of the laminate 104.

For example, as shown, a switching signal may be received from a power element 132 of the array 130. The signal traverses connections 120 to a capacitor 116. While shown as a direct line, the connection 120 may pass through multiple vias in buildup layers 108, 110 to traverse different levels therein. While the build up layers 108, 110 are shown as a single layer, it shall be understood that such layers may be formed of multiple layers. As such, connections 120 are illustrative only. The signal received by capacitor 116 through connection 120 is also provided to a power terminal of the die 102 through connection 122. Of course, the connection 122 may pass through multiple vias in build up layers 108, 110 to traverse different levels therein. The capacitor 116 may be referred to as "de-coupling capacitor" in some cases. The purpose of the capacitor 116, in such a case, is to provide a "near" power supply to thereby reduce inductive losses in the switching signal. Thus, the closer the capacitor 116 is to the die, the better. Both the capacitor 116 and the die 102 are connected to a common ground or negative terminal 135 in the illustrated embodiment along connection 137.

It has been discovered, however, that the connections of the capacitor to the combination of the laminate 104 and solder mask 110 (generally referred to as the "board" 150 herein) may be susceptible to breaking when a stress such as board warpage occurs. Also, it has been discovered that in some cases, warpage may cause connections between the die 102 near its edges or corners to break.

Figure 2:
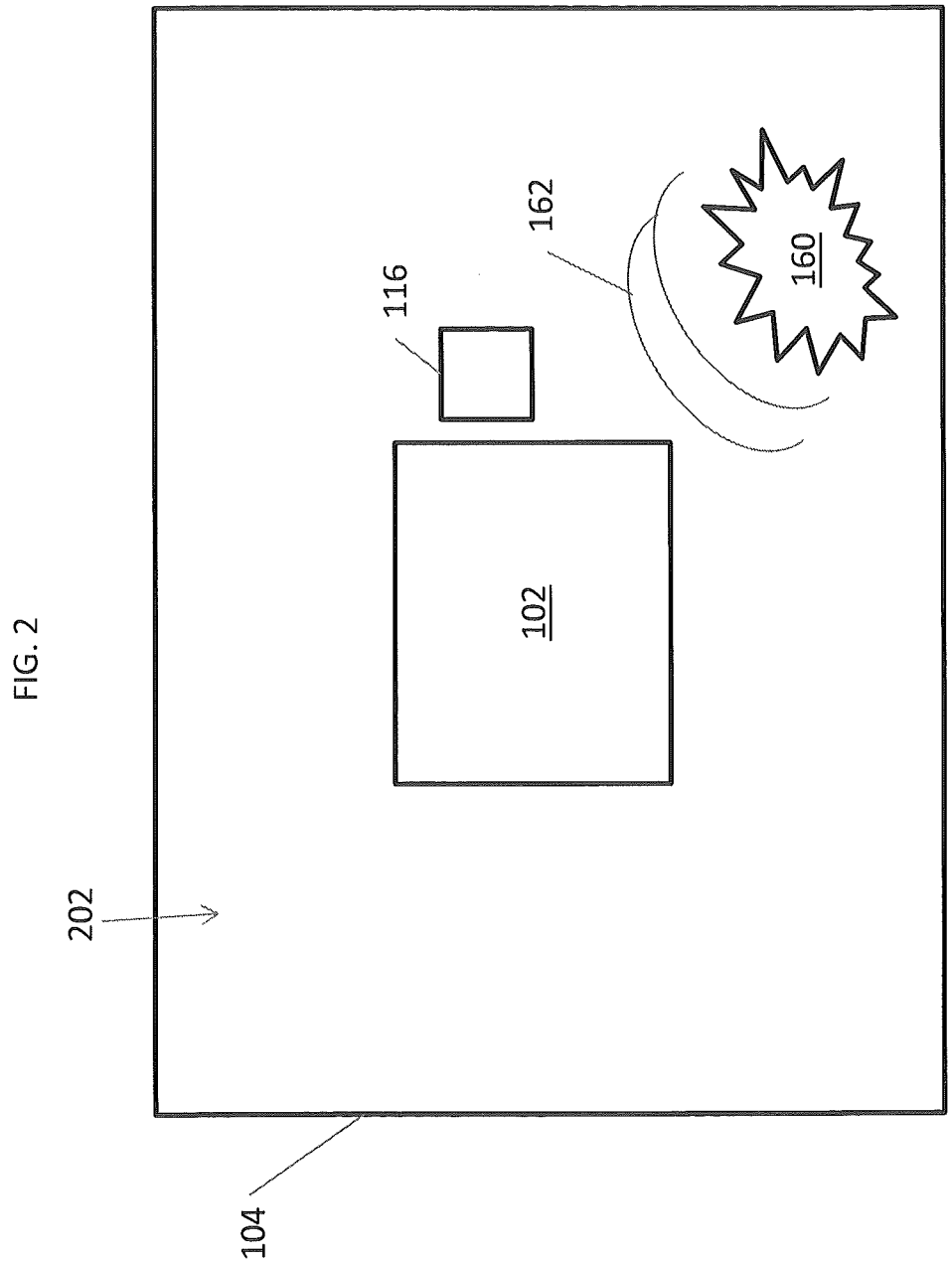
FIG. 2 shows a top-view of an example of a laminate including a source of warpage.

FIG. 2 shows a top view of a laminate 104 according to one embodiment. The laminate includes die 102 and capacitor 116 disposed on an upper surface 202 thereof. The upper surface 202 corresponds to the solder mask 110 discussed above. The laminate also includes a region where a stress on the board may be created that is designated as stress region 160. The stress region 160 may be a region where elements with different CTE's are closely located (e.g. a regions with heavy wiring) or any other region where laminate warpage may occur. The stress region 160 may be discovered by exposing the laminate 104 to thermal cycling with after, for example, the die 102, capacitor 116 or other elements have been attached to it. The thermal cycling my lead to warpage shown by warpage lines 162 in FIG. 2.

Figure 3:
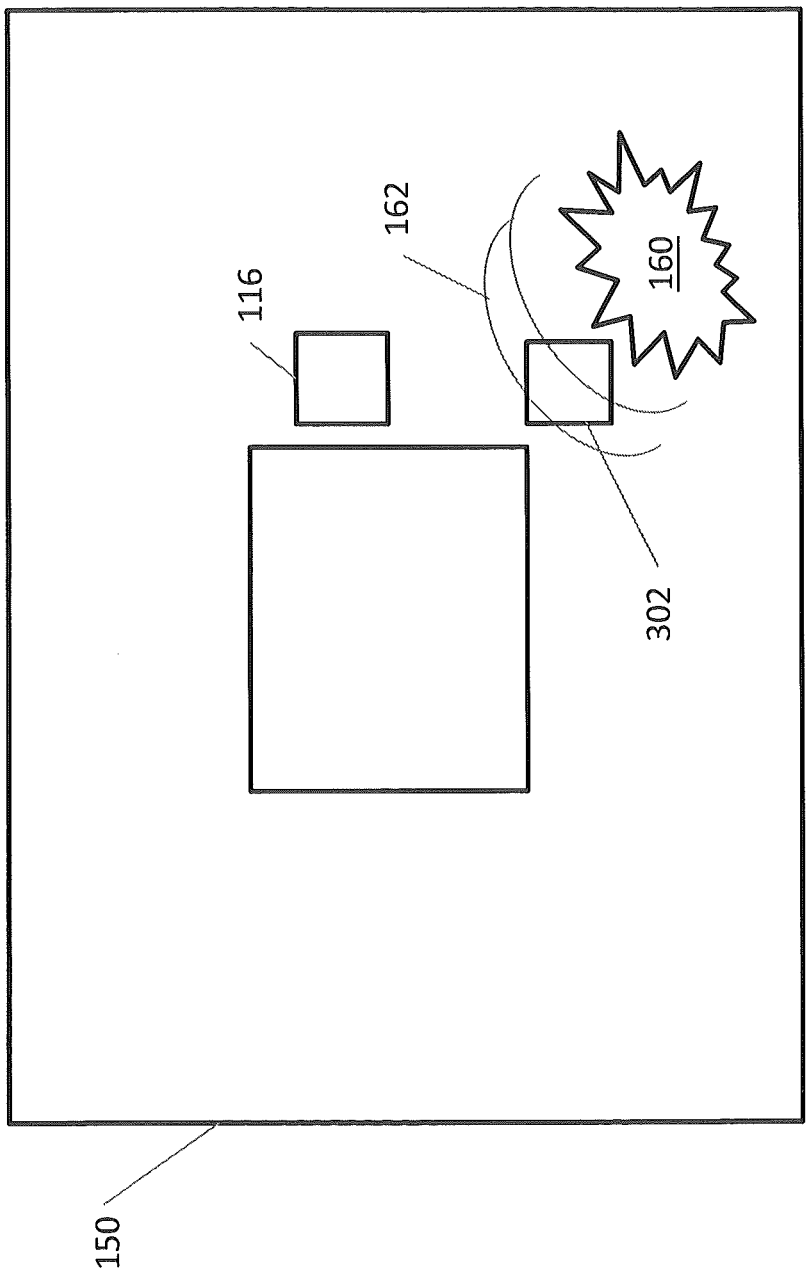
FIG. 3 shows a top-view of an example of a laminate including a source of warpage with a warpage control element disposed to flatten out warpage.

According to one embodiment, an upper surface 202 of the board (e.g., solder mask 110) may be etched or other otherwise thinned or locally thickened to compensate for global warpage. With reference now to FIGS. 1 and 3, a warpage control region 302 is formed in an area that overlies the warpage lines 162 (e.g., the location in the board where warpage has previously been discovered to exist. In one embodiment the warpage control region 302 may be formed by thinning the solder mask layer 110 in those regions. In another embodiment, dielectric film may be placed in certain regions on top of the mask layer 110 to thicken that area. In yet another embodiment, a laminate may include warpage control regions that are thinning regions and others that are thickening regions.

The warpage control region 162 may be formed, for example, by forming cuts or other depressions in the solder mask layer 162. Such a region may be referred to as a thinning region herein. Such cuts/depressions may be formed by placing a mask and chemical etching or by using a laser or a combination of both. In such a case, the region may be a 5 μm×5 μm grid having one or more different levels form by such laser cutting, etching or a combination of both.

Alternatively, the warpage control region 162 may be formed by adding a dielectric film that is the same or similar to the material forming the solder mask. Such a warpage control region may be referred to as a thickening region herein. The sizing of such regions may be the same or similar as a thinning region in one embodiment.

Figure 4:
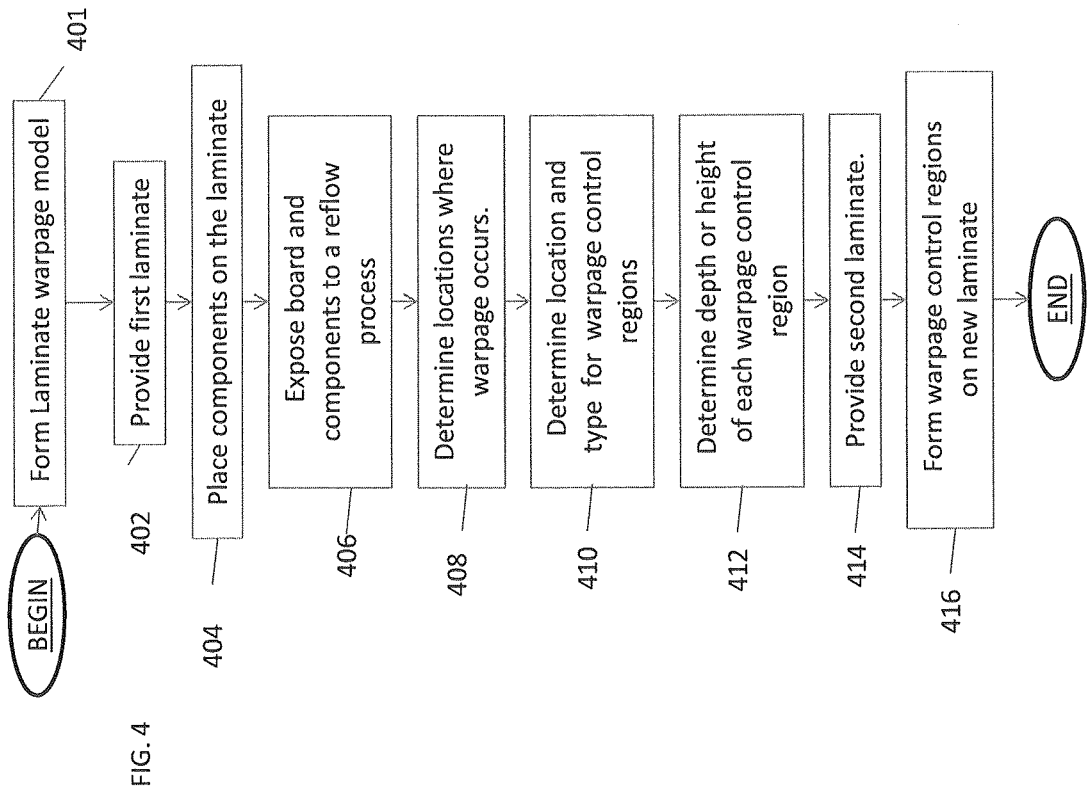
FIG. 4 is a flow chart showing one method to flatten warpage according to one embodiment.

The location and type of the region 162 may be determined as described in relation to FIG. 4 in one embodiment.

FIG. 4 is a flow charts describing one manner in which the location of one or more warpage control regions 302 may be determined. At block 401 a warpage model is used to make a first approximation of where elements are to be added/removed to control warpage. Such a model may be formed by understanding of the layout of the laminate and where stresses may occur.

At block 402 a laminate is provided. The board may include some or all of the interconnects and vias needed to form a complete system when appropriate elements (e.g., dies/capacitors/resistors/etc.) are placed on it. The laminate may also include connection location having solder paste filling holes in the solder mask.

At block 404 one or more components are placed on the laminate. The process of placing the components can include depositing a die with associated C4 balls or other connection mechanisms (e.g., wires) on the corresponding holes in the solder mask. Other elements, e.g., capacitor 116, may also be placed in the same manner.

At block 406, the board including the components is exposed to a reflow process. The reflow process is a process in which the pre-solder is melted to form a permanent bond between the component and the board. As is known, the temperature of such a process is high. It has been discovered, and as described above, that such high temperatures can lead to board warpage due to the differing CTE's of elements in the board.

At block 408, after the reflow process, the location where warpage occurs is determined. The may be several different areas where warpage occurs.

At block 410 one or more locations to form warpage control regions 162 are determined. In one embodiment, a warpage control region will be located at one or more locations where an upper surface of the board is buckled upwards. In addition, the location where troughs occur (due to the buckling) can also be determined.

At block 412, the depth of the warpage control regions at the locations determined in block 410 is determined for cases where a thinning region is to be applied. Block 412 may also or alternatively, determine the height of the film to added if thickening region is to be placed.

At block 414, a new laminate is provided. This laminate may have the warpage control regions formed in the locations and of the type determined at block 412 in block 416. The warpage control regions can be formed before or after the die is connected to the laminate but is performed before a reflow process occurs. The warpage control regions will help to reduce or eliminate warpage during such a reflow process.

The above description may be thought of as a global correction to warpage. In one embodiment it may provide the warpage control regions such that after a reflow, the surface of the laminate is flat or substantially flat. In other cases, certain warpage control regions can be added to protect various components placed on laminate. Consider an example where a laminate is integrated into a portable device. In such a case, if the device is dropped, a force may be transferred across the laminate towards an edge of the die. In such case, it may be beneficial to have thickening or thinning regions near edges and/or corners of the die to prevent a pressure wave or the like from hitting the edge of the die and stressing connections between the die (or other component) and the substrate. Thus, there may be times where, near a component, the solder layer has its thickness varied. As illustrated in FIG. 5, example thickened feature locations are shown. These features may also help reduce possible damage to the connections between the die and the laminate due to uncontrolled warpage in one embodiment.

In more detail, in FIG. 5, a top surface of a laminate 502 is shown. A die 504 is connected to that top surface 502 as is component 506 such as a capacitor. One or more protecting features 508 may be provided to protect edges or sides of the die or component from stresses emanating from other locations on the die. The features 508 may be straight (508a), from obtuse angles (508b), form right angles 508c or form acute angles 508d. Such protecting features may be formed as either troughs or built up elements or a combination of both. The protecting features, thus, may be formed in manners similar to the thinning and thickening regions described above. That is, in one embodiment, the protecting features may be trenches formed in the solder mask and in another they may be formed by adding a dielectric material to the top surface of the solder mask. The protecting features may server to reduce or direct stresses from the regions of the less sensitive regions of the top surface.

Further, during operation, the die itself can cause pressure to exist in the laminate. With reference now to FIG. 6, a laminate 600 is shown with a die 602 connected thereto. During operation, the die 602 may develop local hot spots (e.g., under a core) that are shown by regions 604, 606. It has been discovered that these hot spots may lead to similar CTE issues as described above. In some cases the effects are such that the electrical connections between the laminate 600 and the die 602 at the edges of the die 602 may be stressed and even break. In FIG. 6, an example of such connections are shown by connectors 610.

Also illustrated in an underfill layer 608. Underfill is generally dispensed on a corner or in a line along the edge of the die with capillary action to transport the underfill under the die 602. After dispense, the underfill is typically heated in order to cure it. The underfill can during dispense move outward as well and the exact edge may not be known. Note that connectors 610 extend through the underfill 608. That is, the underfill 608 may surround the connections in one embodiment.

According to one embodiment, and with reference now to FIGS. 6-8 at or near edges of the die, one or more depressions 620 may be formed. These depressions may serve to direct the stresses from the edges die 602 to regions of the laminate 600 that is less sensitive to CTE or other forms of stresses. The depressions may include side walls 622 that extend downwardly at an angle α. Values for α may vary from any value including and between 45 to 85 degrees.

Further, and as best illustrated in FIG. 8, the depressions 620 may also serve to limit the outwardly flow of underfill 608. Such control may be beneficial in that by controlling outward flow, the bounds of the flow may be known and allow for elements to be placed closer together as less room may be needed to account for overflow.

In some instances, multiple elements (e.g., capacitors or any other supporting element) may need to be located close to a particular die. With reference to FIGS. 9A and 9B, consider the example where multiple capacitors 900a-900n (collectively, 900) are to be used in supporting operation of die 902. In such a case, the capacitors will all have to be placed (and there could be over 100 in some cases) before a reflow process that locks them into position occurs. However, even slight air or physical perturbations can cause the capacitors to move. Further, the same may also be true of the die 900 but only the capacitors 900 are discussed for simplicity.

According to one embodiment, the solder mask 920 of the laminate 904 includes depressions 910 that correspond, in this example, to a particular capacitor 900. That is, depression 910a corresponds to capacitor 900a. The depressions extend only part way through the solder mask 920. In one embodiment, contacts 950 may be formed on an upper surface of the bottom 922 of the depression 910 (see, e.g., depression 910c). The walls of the depressions can have the same angle α shown above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a module comprising:
   receiving a laminate, the laminate including a single layer solder mask layer forming a top layer of the laminate;
   placing a die on a top of the solder mask layer;
   forming at least one depression near an edge of the die after the die is placed in an upper surface of the solder mask layer that does not pass all of the way through the solder mask layer, the depression formed near an edge of the die after the die is placed;
   placing a first electronic element in a first of the at least one depressions; and
   exposing the laminate to a reflow process after the first electronic element is placed.

2. The method of claim 1, wherein the first depression includes one or more connection locations formed in a lower surface of the first depression.

3. The method of claim 1, wherein the first electronic element is a capacitor.

4. The method of claim 1, wherein the at least one depression includes a second depression, the method further comprising:
   placing a second electronic element in the second depression.

5. The method of claim 4, wherein the second electronic element is a die.

6. The method of claim 4, wherein the second electronic element is a capacitor.

7. The method of claim 4, wherein the second depression includes one or more connection locations formed in a lower surface of the second depression.

8. The method of claim 1, further comprising:
placing underfill near or under the die.

* * * * *